United States Patent [19]

Rademakers

[11] Patent Number: 5,237,872

[45] Date of Patent: Aug. 24, 1993

[54] ANGULAR VELOCITY SENSOR

[75] Inventor: Petrus J. Rademakers, Aerdenhout, Netherlands

[73] Assignee: Datawell B.V., Haarlem, Netherlands

[21] Appl. No.: 644,584

[22] Filed: Jan. 23, 1991

[30] Foreign Application Priority Data

Jan. 23, 1990 [NL] Netherlands ................. 9000163

[51] Int. Cl.$^5$ .............................................. G01P 3/46
[52] U.S. Cl. ........................................ 73/505; 324/163
[58] Field of Search ............. 73/505, 516 LM, 517 A, 73/518; 324/163, 165

[56] References Cited

U.S. PATENT DOCUMENTS

| | | | |
|---|---|---|---|
| 2,785,376 | 3/1957 | Hazeltine | 324/163 |
| 3,176,520 | 4/1965 | Aske | 73/516 LM |
| 3,238,787 | 3/1966 | Riordan | 73/516 LM |
| 3,641,816 | 2/1972 | Chambolle et al. | |
| 4,015,471 | 4/1977 | Marsh | |
| 4,188,576 | 2/1980 | Jacobs | 324/163 |
| 4,270,387 | 6/1981 | Hoffman | |

FOREIGN PATENT DOCUMENTS 2462710 2/1981 France.
6604335 11/1966 Netherlands.
1219890 1/1971 United Kingdom.

OTHER PUBLICATIONS

Halliday et al., Physics, New York, John Wiley & Sons, Inc., 1964, pp. 786-788.

Primary Examiner—John E. Chapman
Attorney, Agent, or Firm—Larson and Taylor

[57] ABSTRACT

An angular velocity sensor is provided with a spherical liquid inertia mass, preferably mercury, which can rotate with respect to a vessel in which it is contained. A magnetic field passes through the inertial mass and the electrode pairs. One electrode of each pair of electrodes between which a voltage is measured is located in the center and the other near the wall of the spherical mass and/or in which the direction of the magnetic field is invariable in space.

13 Claims, 3 Drawing Sheets

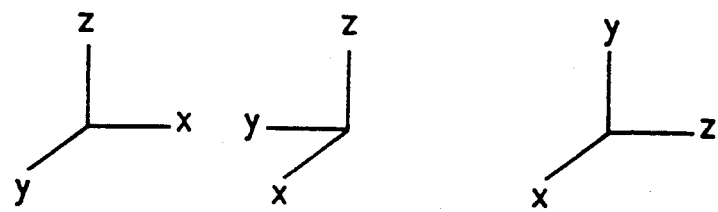
FIG. 1a
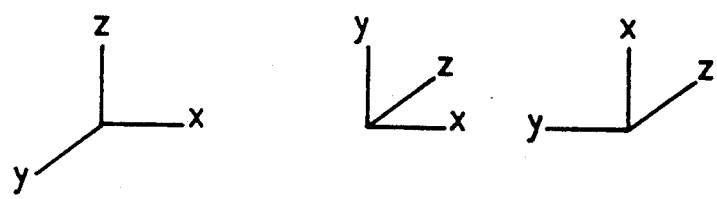
FIG. 1b
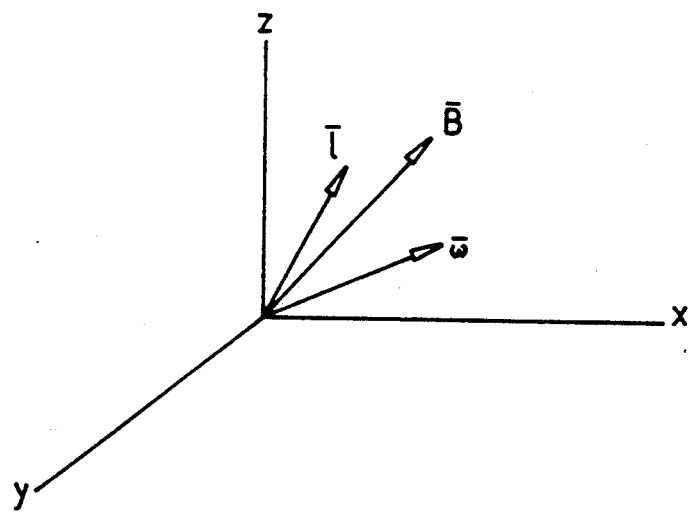
FIG. 2
FIG. 3
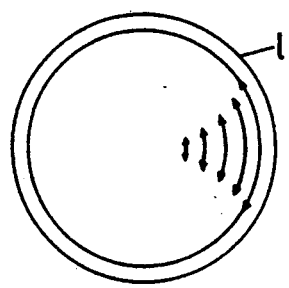

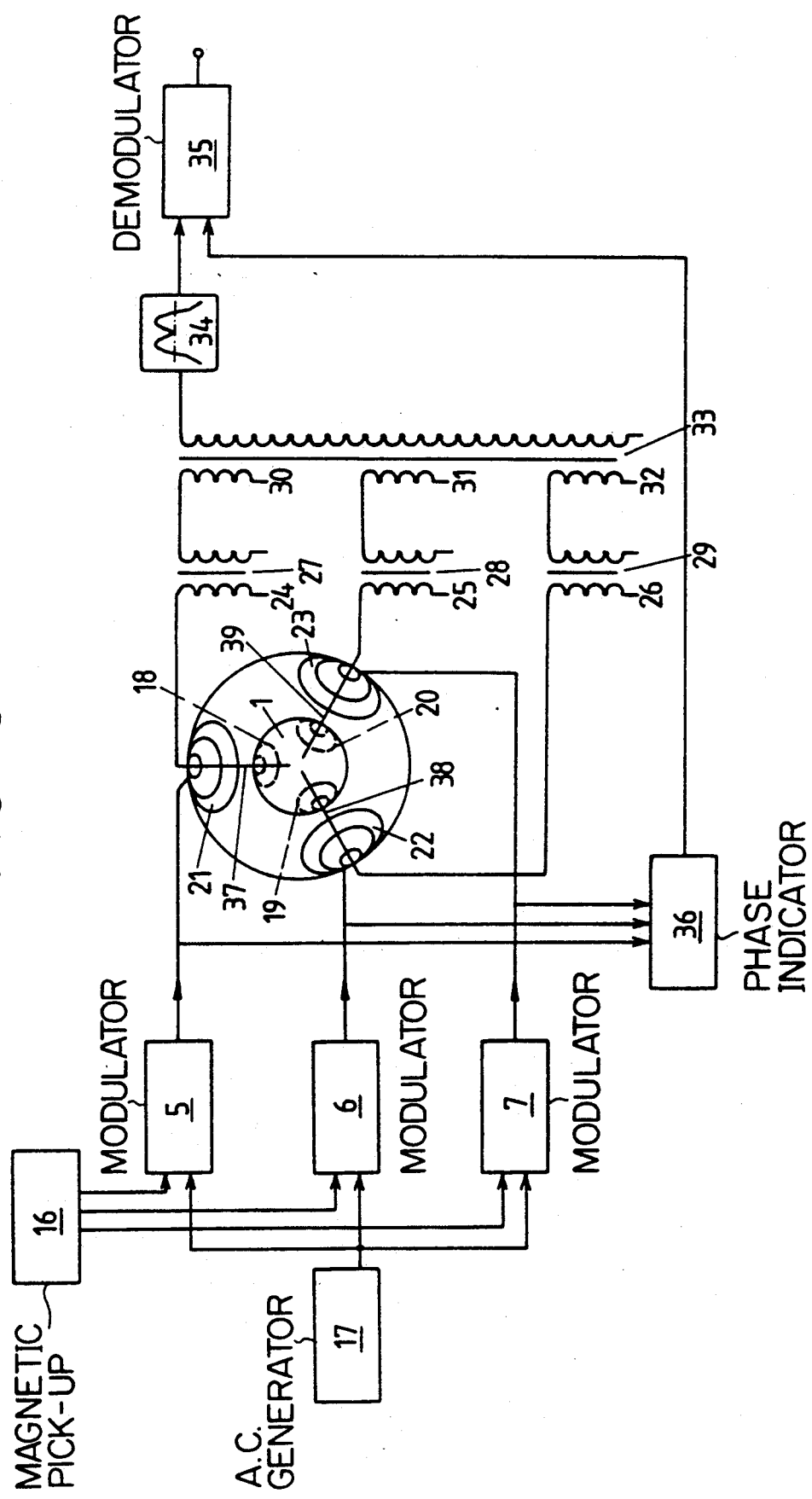

ANGULAR VELOCITY SENSOR

BACKGROUND OF THE INVENTION

The invention relates to an angular velocity sensor for a movable system provided with an electrically conducting inertial mass through which an almost uniform magnetic field passes, whose mass is rotatable with respect to the system but is translatively fixedly connected to it. The sensor has at least one pair of electrodes contacting the mass. The electrodes are fixedly connected to the system and are spaced apart by a distance, the electrode vector, and are connected to a receiving device by conductors.

Such an angular velocity sensor is known from "Final Report for Period 20 February 1978-30 Dec. 1978 Contract No. DNA002-78-C0126" of R.E. Weber, The Singer Company, Kearfott Division at Fairfield, N.J. 07006.

In this angular velocity sensor, the magnetic field is generated by a magnet which is fixedly connected to the system. Using this sensor, the angular velocity can only be determined about one axis, which is fixedly connected to the system. This leads to a number of disadvantages.

A first disadvantage is that the use of such an angular velocity sensor becomes very complicated when determining angular rates in space, for instance about three mutually perpendicular axes. Moreover, a disadvantage occurs when determining the angular position from the angular velocity about axes which move along with the system. In this case, different results may be obtained, dependent on the sequence in time of the different angular velocities.

SUMMARY OF THE INVENTION

The invention aims in different embodiments to eliminate at least one if not both of the two indicated disadvantages, or at least reduce them considerably.

According to a first aspect of the invention the magnetic field has a direction in space which is independent of the angular position of the system in space. As will be further indicated in this specification, this feature enables the determination of the angular velocity of the system about this independent direction, allowing fewer measurements to suffice in determining angular velocity.

It is possible to obtain a magnetic field which has a fixed direction in space by coupling means for generating a magnetic field, such as permanent magnets, with a gyroscope.

This embodiment of the invention is, however, relatively complicated and has with certain applications, such as determination of position and direction in measuring buoys for oceanographic research, the disadvantage that it is difficult to keep a gyroscope running without adjustment or service for several years. This is relevant in that during a long time lapse the occurrence of drift cannot be avoided, even with drift compensated gyroscopes such as those that are disclosed in U.S. Pat. No. 4 270 387.

According to a further embodiment of the present invention, the sensor contains three or more electrode pairs, which together form the base of a three-dimensional space. As will be discussed below, by using a sensor with three electrode pairs, the angular velocity about the direction of a magnetic field in space can be measured.

Though three electrode pairs are sufficient for an unambiguous angular velocity determination in space it may be advantageous to use more than three electrode pairs, where redundancy may have advantages.

A preferred embodiment of the invention, which is relatively simple, provides that three electrode vectors are present which are mutually perpendicular, where the inertial mass may consist of a liquid in a spherical vessel, and the liquid, in agreement with the above mentioned report, may be mercury. Mercury has, by its large electrical conductivity and its very small kinematical viscosity, important advantages when applied in an angular velocity sensor of the type with which the present invention is concerned.

In the already mentioned U.S. Pat. No. 4 270 387, use is made of a liquid inertial mass. This mass, however, is contained in an annular space and is brought into fast rotation by electro-magnetic means in order to serve as a gyro mass.

The British Patent Specification GB 1 219 890 describes a gyroscope with a body of conducting liquid, especially mercury, which is put into rotation in a spherical vessel in order to serve as a gyroscopic inertial body.

According to a further embodiment of the invention, one of the electrodes of each pair is near the center of the sphere and the other electrode is near the wall of the sphere.

In this way, an angular velocity sensor is obtained which has a simple surveyable construction.

It has appeared that with rotation about the direction of a magnetic field, which direction is known, the rotation of the system about this direction is given by the scalar sum of the voltages which occur between the electrodes of the three pairs.

When applying the invention to obtain the direction of the magnetic field, which is independent of the angular position of the system in space, i.e, the earth's magnetic field, it is possible to provide that the system is fixedly connected to a magnetic pick-up for measuring three mutually perpendicular components of the earth's magnetic field and that the angular velocity sensor is provided with magnetic energizing means for generating a magnetic field in the inertial mass having the same direction as the earth's magnetic field. This yields not only the advantage that the earth's magnetic field is amplified or can be changed into an alternating field, but it is now possible to measure the earth's magnetic field in a location where possible disturbances of the magnetic field are limited, such as for instance the top of a ship's mast.

From U.S. Pat. No. 3,614,816, it is known per se to measure a magnetic field in two mutually perpendicular directions in order to determine the correct direction of the velocity component which is obtained by means of an electro-magnetic liquid velocity measurement.

Cases may, however, occur in which measuring angular velocities about an axis independently of the system is not important. In that instance, the invention provides a considerable improvement with respect to the techniques known from the publication of R.E. Weber by providing an angular velocity sensor provided with an electrically conducting liquid mass which can rotate with respect to a movable system, but translatively is fixedly connected to the system. Members for generating a magnetic field are also fixedly connected to the system, and at least one electrode pair, the electrodes of which are spaced apart in space by a distance, the electrode vector, which according to a further aspect of the invention is characterized in that the liquid mass has the shape of a sphere, that at least three electrode pairs are present and that of each pair, one electrode is near the center of the sphere and one near the wall of the sphere.

Further it has appeared, that with both embodiments of the invention it may be advantageous if the generated magnetic field is an alternating field.

In that instance, the impedance of the electrode circuit can be adapted in a relatively simple way to the measuring device by means of a transformer, such that a minimum influence of noise on the measuring device is obtained. Then it is possible to separately measure rotations about different axes moving with the system, making use of different frequencies of the alternating field in the different energizers.

When a magnetic field, and especially an alternating field, is generated, the possibility exists that the loops formed by the conductors which run from the electrodes to the receiving devices and/or a measuring device can pick up signals, which cannot be neglected in comparison with the relatively weak signal which is obtained as a measuring signal.

Accordingly, in a further embodiment of the invention, the conductors which connect an electrode pair with an auxiliary transformer of a measuring device and also the primary windings of this transformer themselves are carried out coaxially, thereby obtaining, a minimum of magnetically induced disturbance voltage.

BRIEF DESCRIPTION OF THE DRAWINGS

The invention is further elucidated by the drawings, in which:

FIGS. 1a and 1b show rotations in different successions;

FIG. 2 is a vector diagram;

FIG. 3 shows the velocity distribution of a liquid in an oscillating sphere;

FIG. 6 is a schematic diagram of a complete device according to the invention.

DETAILED DESCRIPTION OF THE PREFERRED EMBODIMENTS

Figure 4:
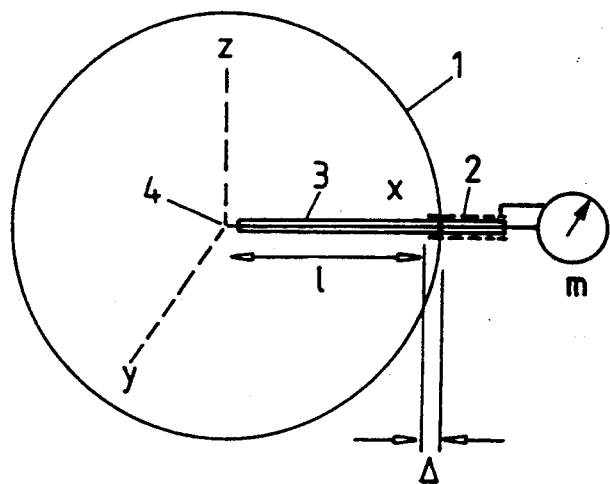
FIG. 4 shows the position of a single electrode pair.

In FIG. 1a, a rotation of an axes system is indicated, first 90° about the z axis and after that 90° about the x axis.

In FIG. 1b, the same rotations have been applied, but in reversed succession. The final result differs completely from that of FIG. 1a.

If only the complete rotations about z, x and y during $\Delta t$ are known, the final result will be unknown. Therefore, one needs to know the angular rotations about the axes as function of time.

The supposition that the angular rotations occurred with constant angular velocity during $\Delta t$ is only justified if $\Delta t$ is small in comparison with the period of the highest angular rotation frequency. Consequently, for a reliable result, an extremely small value of $\Delta t$ would be necessary, which means a very high sample rate frequency.

In the following discussion of FIG. 2, a detailed description of which voltage signal is obtained with a predetermined magnetic field in dependence on the angular velocity is provided.

If a charge Q moves with a relative velocity v through a magnetic field B, a force K will be exerted on the carrier of the charge which is proportional to the product $QBv\sin\phi$, in which $\phi$ is the angle between v and B, and this force K is perpendicular to B and v shown in vector notation as:

$$K = Q \cdot B \times v$$

The electrical field strength F, the force per coulomb, is $$F = B \times v$$

Consider the axes system x y z indicated in FIG. 2. Suppose the angular velocity of this system is indicated by the vector $\omega$. The magnetic field is indicated by the vector B.

The force per coulomb exerted on a charge carrier which is located on the location vector 1 which rotates together with x y z, is then:

$$F = B \times (\omega \times 1)$$

The voltage difference V between the beginning and the end of the location vector equals:

$$V = \int_0^1 [B \times (\omega \times l)] \cdot dl$$

$$= \int_0^1 ((\omega \times l) \times dl) \cdot B$$

$$= \int_0^1 B \cdot l \omega \cdot dl - B \cdot \omega \, dl \cdot l$$

We now consider the sum of the voltage differences over three location vectors $1_{xm}$, $1_{ym}$ and $1_{zm}$ coinciding with the x y and z axis respectively.

If we indicate the components of B and $\omega$ in the direction of the x, y and z axis with x, y, z indices respectively, then we obtain for the sum voltage $V_x$:

$$V_s = V_{1xm} + V_{1ym} + V_{1zm} = \int_0^{l_{xm}} B_x l_x \omega_x dl_x +$$

$$\int_0^{l_{ym}} B_y l_y \omega_y dl_y + \int_0^{l_{zm}} B_z l_z \omega_z dl_z - \int_0^{l_{xm}} B \cdot \omega \, l_x dl_x -$$

$$\int_0^{l_{ym}} B \cdot \omega \, l_y dl_y - \int_0^{l_{zm}} B \cdot \omega \, l_z dl_z$$

If the B field is uniform, $B_x$, $B_y$ and $B_z$ are independent of x y z and $1_{xm} = 1_{ym} = 1_{zm} = 1$ then:

$$V_s = (B_x \omega_x + B_y \omega_y + B_z \omega_z) 0.15^2 - B \cdot \omega \, 3 \, 1^2/2$$
$$= -B \cdot \omega 1^2$$

Consequently $V_s$ equals $-B1^2$ times the angular frequency about the magnetic vector B.

Summarizing it can be said that if, in a perpendicular coordinate system x y and z, the voltage of the points 1,0,0, 0,1,0 and 0,0,1 with respect to the origin are added scalarly, this gives a total value which is proportional to that of the uniform magnetic field B, the length $l^2$ and the angular velocity $\omega$ of the magnetic vector B.

To obtain a signal, it must be the case that the conductive mass does not have to move along with the system. Therefore, referring to FIG. 3, if the vessel 1 shown is completely filled with liquid, preferably mercury, the liquid cannot carry out translative movements with respect to the system.

If, however, the vessel oscillates about a center line, the liquid immediately near the wall will completely follow, but, due to inertia of the mass, the oscillations of the liquid will decrease quickly as a function of the distance to the wall in an inward bound direction.

If the wall of the sphere oscillates with an angular frequency o then the function of the decrease will equal $$\frac{R^2}{r^2} e^{-((R-r)/\delta)}$$

in which
R = the radius of the sphere wall
r = the distance of the considered point from the center of the sphere
$\delta$ = penetration depth
$\delta = +\sqrt{(2v/\sigma)}$
in which $v$ is the kinematic viscosity of the liquid. Vide H. Lamb "Hydrodynamics" sixth Revised Edition, N.Y. 1945, par. 354.

If mercury is chosen as the liquid, the penetration depth becomes $\{v_{kwik}$ is $0.114 \ 10^{-6} \ m^2/sec\}$ $\delta = \sqrt{(0.228/\sigma)} \ mm$ As an example, for a frequency of 0.1 Hz, $\delta \sim 0.6$ mm. Dependent on the desired frequency region and the desired accuracy, a distance $\Delta$ with respect to the wall can be determined, such that within $R - \Delta$ the liquid can be considered to be at a stand still.

FIG. 4 shows a preferred mounting of an electrode pair in a spherical vessel which is filled with mercury. A coaxial cable consisting of a conducting outer sheath 2, an insulating sheath 3 and a core of a conducting wire 4 runs along the x axis. The outer sheath protrudes from the outside over a small distance $\Delta$ into the sphere. The central conducting wire 4 goes on until near the center of the sphere, where a small bit of insulation has been removed at that end, so that the inner conductor wire 4 at that location contacts the mercury. The outer sheath also contacts the mercury over a small distance $\Delta$, so that a circuit 4 - mercury - 2 is closed via the non-moving mercury. When the system, and consequently the sphere 1, rotates, the conductor wire 4 will move in the magnetic field that goes through the sphere and consequently will generate an electro-motive force. This equals 0.5 $B\omega l^2$ if the magnetic field runs in the direction of the z axis and the system rotates about the z axis with the angular frequency $\omega$.

In a complete system, a unit analogous to the unit 2, 3, 4 is mounted in the y axis and the z axis. The sum of the signals is then equal to $B\omega l^2$, regardless of the orientation of the B vector in the x-y-z-system.

Figure 5:
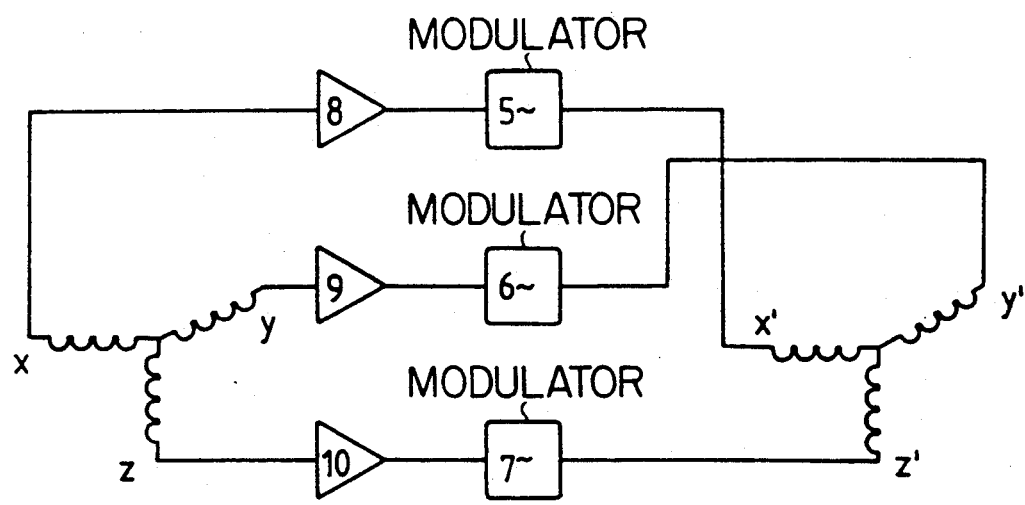
FIG. 5 is a schematic diagram for the generation of a magnetic field with the direction of an external field.

FIG. 5 shows a schematic enabling transformation of a magnetic field into an alternating field with the same direction. Pick-up elements indicated with the mutually perpendicular axes x, y, and z control amplifiers 8, 9 and 10, which via modulators 5, 6, and 7 energize the coils indicated with x', y' and z' for generating a magnetic field which passes through the mercury mass.

Finally in FIG. 6, a schematic of a complete device according to the invention is shown. Magnetic pick-up 16 is fixedly coupled to the movable system and preferably is located where the directional field, normally the earth's magnetic field, has not been disturbed by parts of the system itself. Further, an alternating current generator 17 is present and a plurality of modulators 5, 6 and 7, which modulate the alternating current in dependence on the magnetic field strength ascertained by the magnetic pick-up 16 in the three different coordinate directions.

The energizing currents of the modulators 5, 6 and 7 are, possibly, after amplification, fed to three mutually perpendicular energizing windings 18, 19 and 20 and currents proportional to them are fed to compensation windings 21, 22 and 23.

Sensors 37, 38 and 39, which protrude into the mercury sphere 1 are connected via straight coaxial cables to the region until outside the sphere of the compensation windings 21, 22 and 23. From here they are connected to primary coils 24, 25 and 26 of upwardly transforming auxiliary transformers 27, 28 and 29, the secondary windings of which are connected with primary windings 30, 31 and 32 of an adding transformer 33 preferably carried out as an annular transformer, which windings mostly contain only one turn.

The secondary winding of the adding transformer via a band pass filter 34 is connected to a phase sensitive demodulator 35, which receives its phase indication from an element 36, to which a voltage derived from the energizing currents is fed.

Because the measuring voltage generated by the rotation is proportional to the field strength of the magnetic field and possible pick-up voltages in the conductors are proportional to the first derivative of the magnetic field, phase sensitive demodulation is a very efficacious means to eliminate disturbing signals picked up from the generated alternating field.

The use of an energizing field with different frequencies is especially important, if the invention is applied in cases in which the magnetic field is fixedly connected to the system, such as is the case with the known technique according to the report of R.E. Weber, mentioned in the opening part of the specification. Then it is possible to discern between the three mutually perpendicular signals, and a device is obtained which measures the angular velocity about three axes moving with the system, which on the whole is considerably simpler than three separate mutually perpendicular mounted devices as described in said report.

The combination of energizing coils 18, 19, 20 and compensation coils 21, 22, 23 enables a uniform field inside the energizing windings and a zero field outside the compensation windings to be obtained. This prevents picking up voltages which derive from the field generated by the energizing windings and which could form a serious disturbance if no compensation windings were present, especially at low frequencies of the angular velocity being measured. This has been further explained in the co-pending application "Shield magnetization device and angular rate sensor in which such a device has been used" based on the same priority application as the present application.

I claim:

1. Angular velocity sensor for a movable system provided with an electrically conducting inertial mass through which an almost uniform magnetic field passes, said mass being rotatable with respect to the system but translatively fixedly connected to it, whereby at least one pair of electrodes contact said mass, said electrodes being fixedly connected to the system and spaced apart by a distance, the electrode vector, and connected by means of conductors to a receiving device, characterized in that the magnetic field has a direction in space which is independent of the angular position in space of the system and contains three or more electrode pairs which together form the base of a three-dimensional space.

2. Angular velocity sensor according to claim 1, characterized in that there are three electrode pairs, the vectors of which are mutually perpendicular.

3. Angular velocity sensor according to claim 2, characterized in that the electrode pairs have an identical configuration and that means are provided to add scalarly the voltage difference between the electrodes of each electrode pair.

4. Angular velocity sensor according to claim 1, characterized in that the inertial mass consists of a liquid in a spherical vessel.

5. Angular velocity sensor according to claim 4, characterized in that the liquid is mercury.

6. Angular velocity sensor according to claim 4, characterized in that one of the electrodes of each pair is near to the center of the spherical vessel and the other near to the wall of the spherical vessel.

7. Angular velocity sensor according to claim 1, characterized in that the magnetic field has a direction of earth's magnetic field.

8. Angular velocity sensor according to claim 7, characterized in that the system is fixedly connected to a magnetic probe for measuring three mutually perpendicular components of the earth's magnetic field and in that the angular velocity sensor is provided with magnetic energizing means generating said uniform magnetic field in the inertial mass having the same direction as the earth's magnetic field.

9. Angular velocity sensor according to claim 8, characterized in that the generated magnetic field is an alternating field.

10. Angular velocity sensor according to claim 1, characterized in that conductors connecting the electrodes to the primary winding of a transformer in said receiving device comprise coaxial cables.

11. Angular velocity sensor provided with an electrically conducting liquid mass, which can rotate with respect to a movable system, but translatively is fixedly connected to it, members for generating a magnetic field fixedly connected to the system and at least one electrode pair, the electrodes of which are spaced apart in space by a distance, the electrode vector, characterized in that the liquid mass has the shape of a sphere, that three electrode pairs are present oriented along mutually perpendicular axes and that of each pair one electrode is near to the center of the sphere and one near to the wall of the sphere.

12. Angular velocity sensor according to claim 11, characterized in that the electrode pairs have an identical configuration and that means are provided to add scalarly the voltage differences between the electrodes of each electrode pair.

13. Angular velocity sensor for a movable system provided with an electrically conducting inertial mass through which an almost uniform magnetic field passes, said mass being rotatable with respect to the system but translatively fixedly connected to it, whereby at least one pair of electrodes contact said mass, said electrodes being fixedly connected to the system and spaced apart by a distance, the electrode vector, and connected by means of conductors to a receiving device, characterized in that the magnetic field has a direction in space which is independent of the angular position in space of the system and contains three electrode pairs, the vectors of which are mutually perpendicular, and that means are provided to add scalarly the voltage difference between the electrodes of each electrode pair.

* * * * *